United States Patent [19]
Kuroda

[11] Patent Number: 5,332,687
[45] Date of Patent: Jul. 26, 1994

[54] METHOD OF MANUFACTURING A SEMICONDUCTOR MEMORY HAVING A MEMORY CELL ARRAY AND A PERIPHERAL CIRCUIT PORTION SO AS TO IMPROVE THE CHARACTERISTICS OF THE DEVICE

[75] Inventor: Hideaki Kuroda, Kanagawa, Japan

[73] Assignee: Sony Corporation, Tokyo, Japan

[21] Appl. No.: 73,523

[22] Filed: Jun. 9, 1993

[30] Foreign Application Priority Data

Jun. 12, 1992 [JP] Japan ................................. 4-179174

[51] Int. Cl.⁵ ...................... H01L 21/70; H01L 27/00
[52] U.S. Cl. ........................................ 437/52; 437/60; 437/919; 437/228
[58] Field of Search ............... 437/52, 47, 60, 919, 437/48, 228, 225

[56] References Cited

U.S. PATENT DOCUMENTS 4,642,162  2/1987  Brownell et al. .
5,030,585  7/1991  Gonzalez et al. ...................... 437/47
5,077,234  12/1991  Scoopo et al. .
5,218,219  6/1993  Ajika et al. ........................... 257/309
5,240,872  8/1993  Motonami et al. .................... 437/48

FOREIGN PATENT DOCUMENTS 0340524  8/1989  European Pat. Off. .
4113932  11/1991  Fed. Rep. of Germany .
2-162763  6/1990  Japan .

OTHER PUBLICATIONS

Patent Abstracts of Japan JP4082263 Mar. 16, 1992.
Patent Abstracts of Japan JP3120864 Aug. 16, 1991.

Primary Examiner—Olik Chaudhuri
Assistant Examiner—H. Jey Tsai
Attorney, Agent, or Firm—Hill, Steadman & Simpson

[57] ABSTRACT

After an insulator film has been formed on an upper layer of a capacitor constituting a memory cell, the insulator film is wet etched using a photo resist covering only a peripheral circuit portion as a mask and using a plate electrode covering the whole of a memory cell array portion as a stopper. For this reason, a step between the memory cell array portion and the peripheral circuit portion, originating from the formation of the capacitor, is moderated by the insulator film retained only in the peripheral circuit portion.

9 Claims, 17 Drawing Sheets

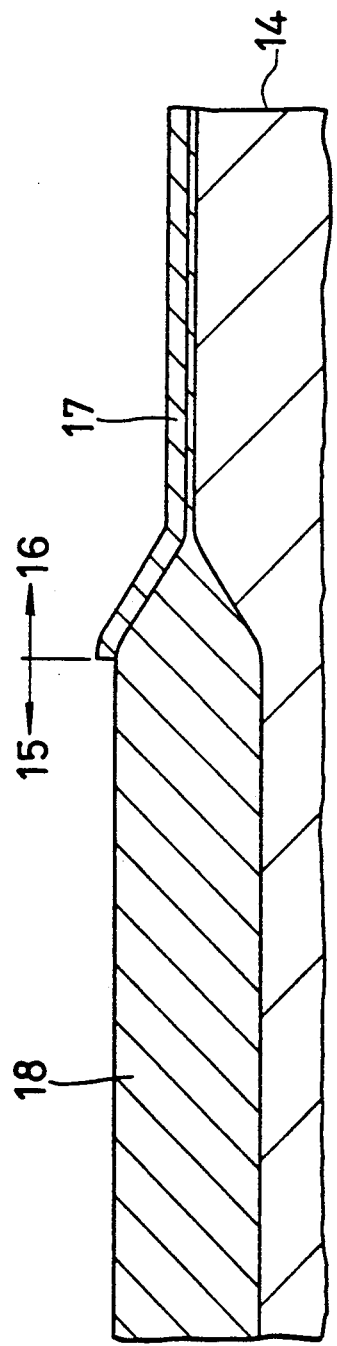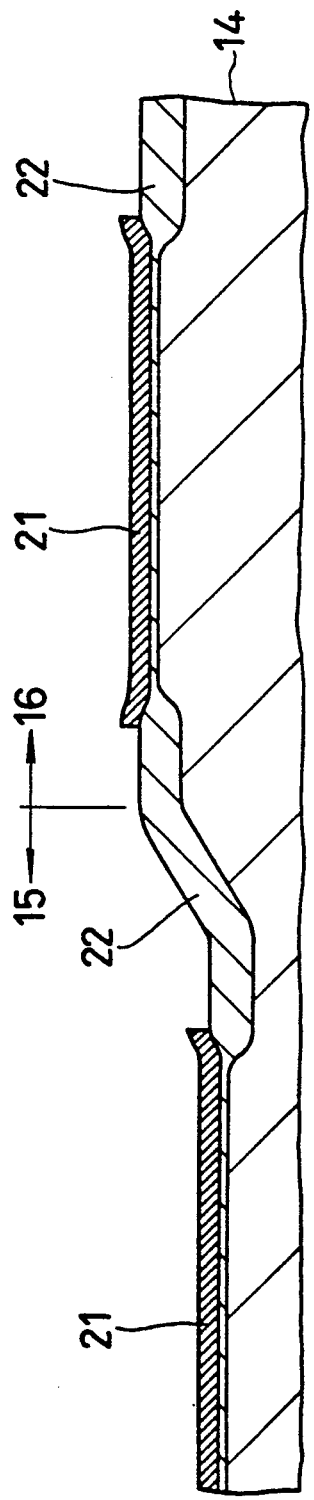

METHOD OF MANUFACTURING A SEMICONDUCTOR MEMORY HAVING A MEMORY CELL ARRAY AND A PERIPHERAL CIRCUIT PORTION SO AS TO IMPROVE THE CHARACTERISTICS OF THE DEVICE

FIELD OF THE INVENTION

The present invention relates to a method of manufacturing stacked capacitor DRAM (Dynamic Random Access Memory).

BACKGROUND OF THE INVENTION

FIG. 15 shows a stacked capacitor DRAM manufactured by a first conventional method. As shown in FIG. 15, with increasing an integration level in a stacked capacitor DRAM, there is a trend that a storage node electrode 12 and a plate electrode 13 of a capacitor 11 are increasingly three-dimensionalized such as to secure a required memory cell capacitance in spite of a small plane surface area of the memory cell.

In the first conventional method as shown in FIG. 15, however, the height of the memory cell is increased by the three-dimensionalized storage node electrode 12, which result in an increase in the step 23 between the memory cell array portion 15 and the peripheral circuit portion 16. For this reason, a focus margin is small during a light exposure in a lithography process after the capacitor 11 has been formed. It causes the difficulty of patterning of a fine bit line 24, and an Aluminum wiring 25, or manufacturing of a DRAM with high yield was not feasible hitherto.

FIG. 16 shows a stacked capacitor DRAM manufactured by a second conventional method. In this second method, the surface of an silicon substrate 14 in the memory cell array portion 15 is lowered relative to that in the peripheral circuit portion 16. In order to achieve this structure, first, an oxidation is carried out under a condition that the peripheral circuit portion 16 is covered with an oxidation-resistant SiN (Silicon nitride) film 17. Thus, as shown FIG. 17, a thick $SiO_2$ (Silicon dioxide) film 18 is formed on the surface of the memory cell array portion 15.

Next, as shown in FIG. 18, both the SiN film 17 and the $SiO_2$ film 18 are removed so that the surface of the memory cell array portion 15 is lowered relative to that of the peripheral circuit portion 16. Thereafter, another oxidation is carried out under a condition that an active region of the memory cell array portion 15 and the peripheral circuit portion 16, respectively, is covered with an SiN film 21 so that an $SiO_2$ film 22 for an isolation is formed.

In the second conventional method, the step between the memory cell array portion 15 and the peripheral circuit portion 16 after the formation of the capacitor 11 can be moderated, compared to the first conventional method. However, as shown in FIG. 16, an excessive film thickness of the $SiO_2$ film 18 to sufficiently moderate the step will increase a step 26 between the memory cell array portion 15 and the peripheral circuit portion 16 before the formation of the capacitor 11.

For this reason, a focus margin is too small during light exposure in a lithography process on patterning of the $SiO_2$ film 22, a gate electrode 27 and the like. Therefore, manufacturing of a DRAM with high yield was not feasible according to the second conventional method, too. On the other hand, since the storage node electrode 12 and the plate electrode 13, both constituting the capacitor 11, are formed only in the memory cell array portion 15, patterning of these is uninfluenced by the steps 23 and 26 and hence relatively easy by nature.

SUMMARY OF THE INVENTION

In view of the circumstances mentioned, it is an object of the present invention to moderate the step between the memory cell array portion and the peripheral circuit portion.

It is an another object of the present invention to secure a sufficiently large focus margin during light exposure in a lithography process.

It is a further object of the present invention to secure a high yield for manufacturing a semiconductor memory device.

In one aspect of the present invention, a method of manufacturing semiconductor memory device includes steps described below. A first insulator film is formed on the whole of a substrate on which transistors and capacitors are provided. A photo resist is formed on the first insulator film which corresponds to a peripheral circuit portion. The first insulator film provided on a memory cell portion is removed by using the photo resist as a mask. A second insulator film is formed on a plate electrodes of the capacitor and the first insulator film of the peripheral circuit portion.

In accordance with the present invention, the step between the memory cell array portion and the peripheral circuit portion, originating from the formation of the capacitor, is moderated by the insulator film retained only in the peripheral circuit portion. For this reason, a sufficiently large focus margin is secured during light exposure in a lithography process after the capacitor has been formed so that patterning of fine wiring is easily feasible.

Moreover, since the insulator film is etched using a stopper covering the whole of the memory cell array portion, the insulator film of the memory cell array portion can easily be removed and thus the step between the memory cell array portion and the peripheral circuit portion can easily be moderated.

Furthermore, the first photo resist can be formed in self-aligning fashion at the step portion of the insulator film by a whole surface etching-back or the like of the first photo resist formed on the insulator film. Therefore, if the edge of the second photo resist is only located on the first photo resist, only a memory cell array portion having higher step within the insulator film can be precisely removed. Therefore, an overlay margin is large on patterning the first and second photo resists, and the step between the memory cell array portion and the peripheral circuit portion can be easily moderated.

BRIEF DESCRIPTION OF THE DRAWINGS

The present invention will be more readily understood with reference to the accompanying drawings, wherein:

FIG. 17 is a sectional view showing the initial stage of the manufacturing steps according to the second conventional method; and FIG. 18 is a sectional view showing a stage following that of FIG. 17.

DETAILED DESCRIPTION OF THE PREFERRED EMBODIMENTS

Figure 1:
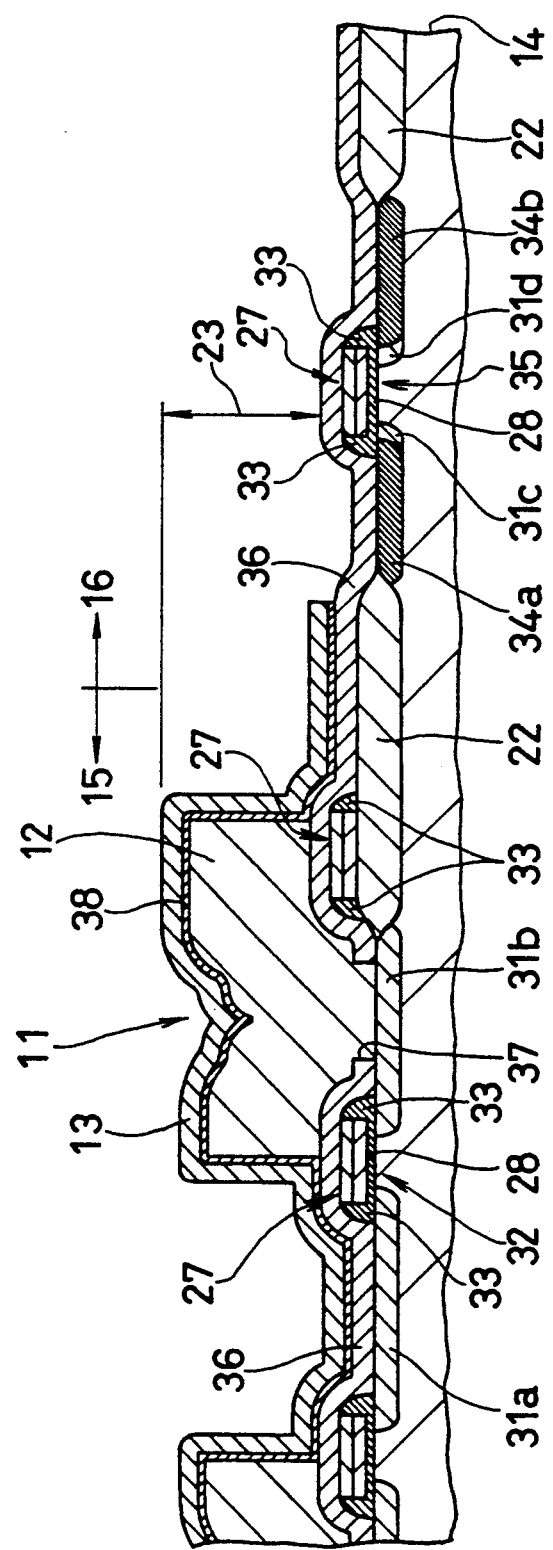
FIG. 1 is a sectional view of a DRAM at the initial stage of its manufacturing steps according to the first embodiment of the present invention.

The preferred embodiments of the present invention will be described in detail by referring to FIGS. 1 to 14. In these drawings, the same reference numerals are utilized as shown in FIGS. 15 to 18 so far as the same portions are referred.

Figure 2:
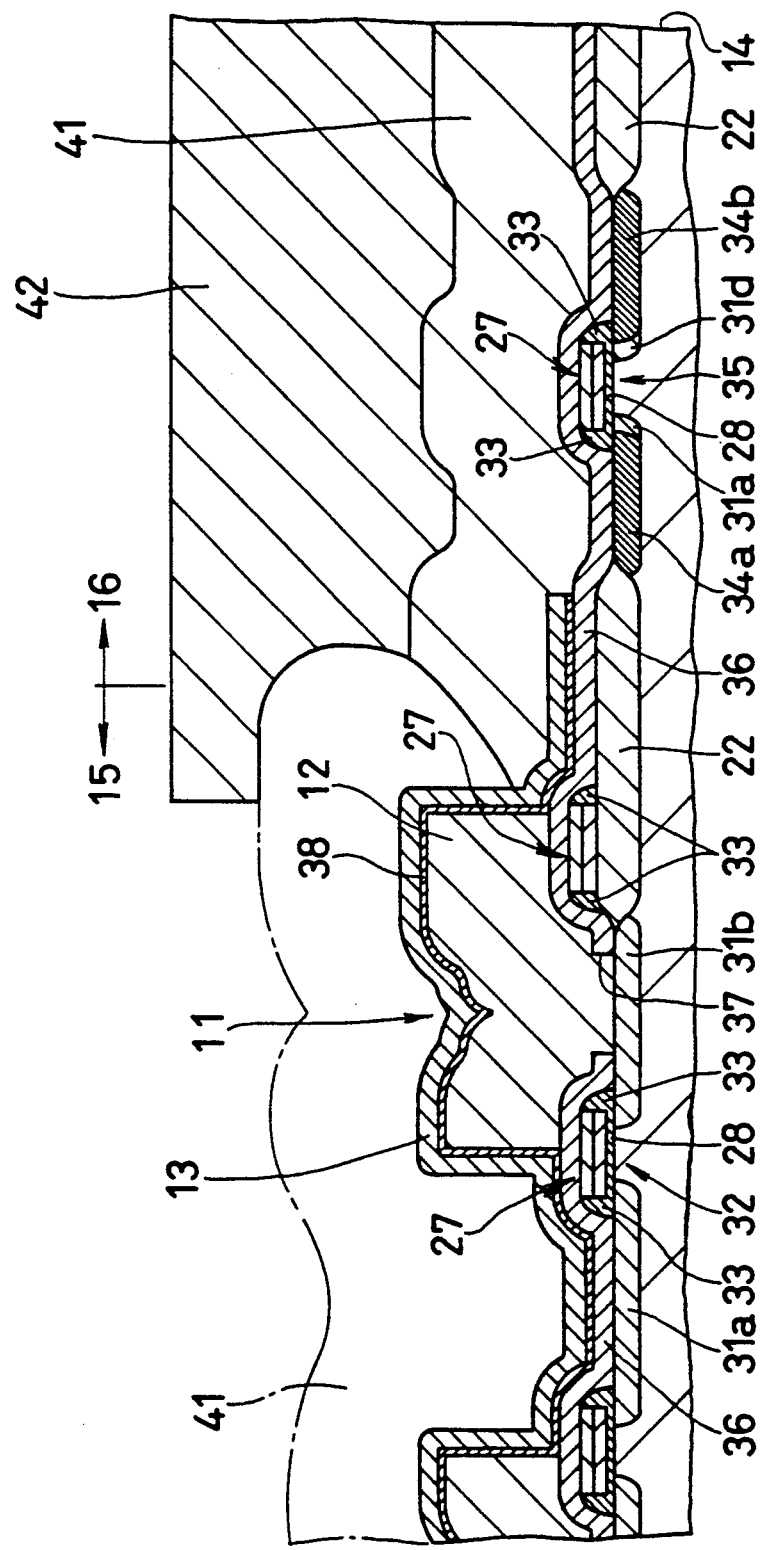
FIG. 2 is a sectional view of the DRAM at the middle stage of its manufacturing steps according to the first embodiment of the present invention.
Figure 3:
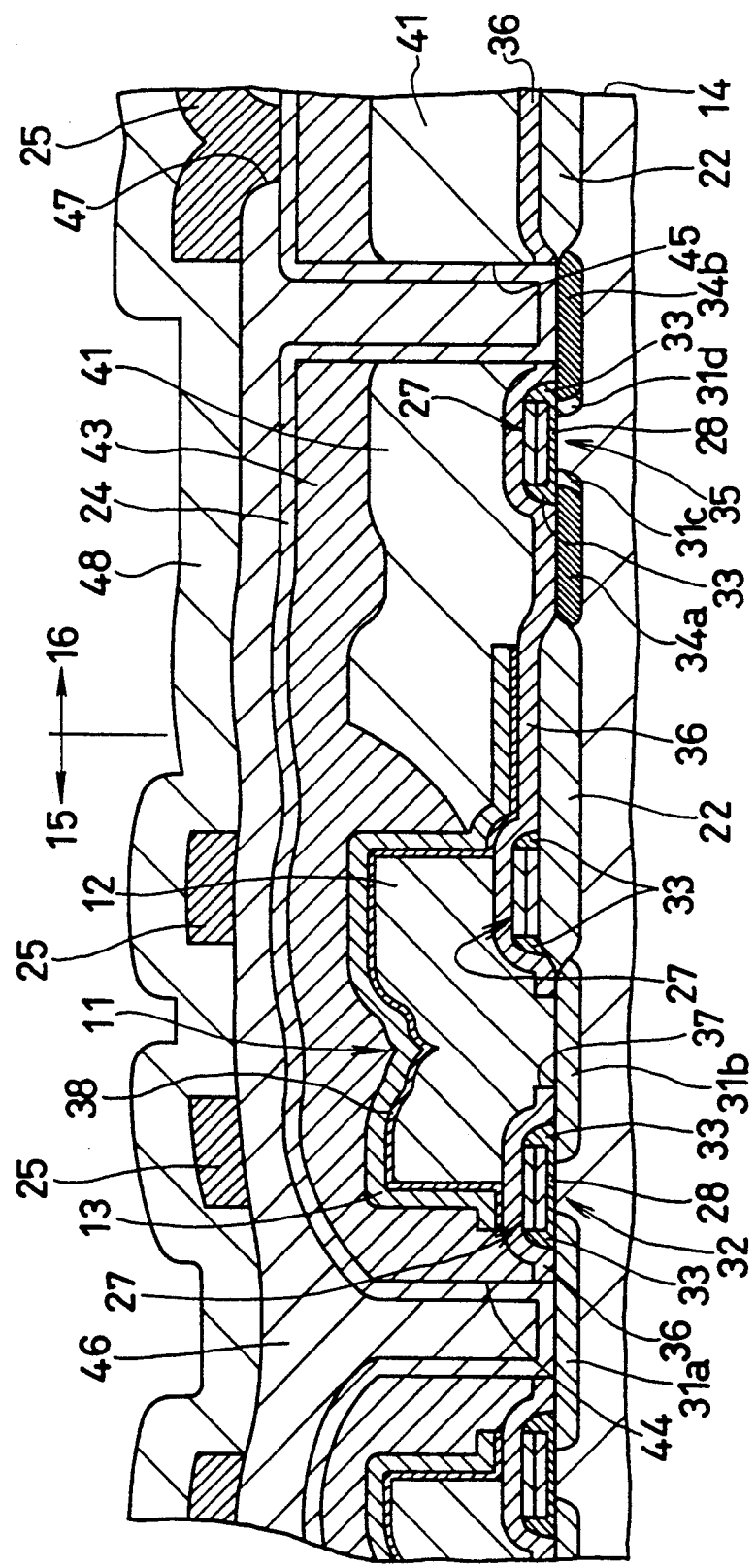
FIG. 3 is a sectional view of the DRAM at the final stage of its manufacturing steps according to the first embodiment of the present invention.

FIGS. 1 to 3 show the first embodiment applied for manufacturing a stacked capacitor DRAM in which a bit line is formed after formation of a capacitor. In the first embodiment, as shown in FIG. 1, an $SiO_2$ film 22 for isolation is grown on a surface of a silicon substrate 14 by the LOCOS (LOCal Oxidation of Silicon) method or the like and, thereafter, an $SiO_2$ film 28 as a gate oxide is formed on a surface of an active region surrounded by the $SiO_2$ film 22. Subsequently, a gate electrode 27 serving as a word line in the memory cell array portion 15 is formed with a tungsten polycide film or the like.

Thereafter, using the gate electrode 27 and the $SiO_2$ film 22 as a mask, $N^-$-type diffused layers 31a to 31d are formed by an ion implantation of N type impurities into the silicon substrate 14 such that the concentration of the N type impurities at the surface of the active region falls into the range of $10^{17}$ to $10^{19}$ $cm^{-3}$. A transistor 32 constituting a memory cell in the memory cell array portion 15 is completed by the steps as mentioned above.

Thereafter, by depositing according to a CVD (Chemical Vapor Deposition) method and subsequent etching-back of an $SiO_2$ film, an SiN film or a polycrystalline silicon film or the like, a sidewall 33 comprising these films is formed at the side part of the gate electrode 27. Then, using the gate electrode 27, the sidewall 33 and the $SiO_2$ film 22 as a mask, $N^+$-type diffused layers 34a and 34b are formed by an ion implantation of N type impurities into the silicon substrate 14 followed by a subsequent annealing. The concentration of the N type impurities at the surface of the active region in the peripheral circuit portion 16 becomes greater than $10^{19}$ $cm^{-3}$. A transistor 35 in the peripheral circuit portion 16 is completed by the steps as mentioned above.

Thereafter, an interlayer insulator 36 is formed by depositing an $SiO_2$ film containing no impurities, a PSG (Phospho silicate glass) film, a BPSG (Boro Phospho silicate glass) film, an SiN film or a combined film of them according to a CVD method, and then a contact hole 37 reaching the diffused layer 31b is formed in the interlayer insulator 36.

By patterning a polycrystalline silicon film having a thickness in the order of several hundreds nm to $1\mu$ and containing N type impurities greater than $10^{19}$ $cm^{-3}$, a storage node electrode 12 is formed such as to be in contact with the diffused layer 31b through the contact hole 37. The storage node electrode 12 can be shaped not only as a nearly rectangular parallelepiped shown in FIG. 1 but also as a fin, a cylinder or the like.

Thereafter, the resultant structure is further treated by depositing a dielectric film 38 like an $SiO_2$ film, an SiN film, a $Ta_2O_5$ film or the like according to a CVD method, a sputtering method or the like. Subsequently, by depositing a polycrystalline silicon film on the dielectric film 38 and then by introducing impurities into the polycrystalline silicon film. By patterning these, a plate electrode 13 comprising the polycrystalline silicon film containing impurities is formed. A capacitor 11 constituting the memory cell in the memory cell array portion 15 is completed by the steps as mentioned above.

It is to be noted that, by the above-mentioned patterning, segments in a contact between the diffused layer 31a and the bit line are not removed, and hence the plate electrode 13 covers the whole of the memory cell array portion 15, As is apparent from FIG. 1, the such of the film thickness of the storage node electrode 12 and the plate electrode 13 is equal to the step 23 after the capacitor 11 has been formed.

Next, as shown in FIG. 2, an insulator film 41 is formed by depositing an $SiO_2$ film containing no impurities, a PSG film, a BPSG film or a combined film of them according to a CVD method. Then a photo resist 42 is coated on the insulator film 41 which corresponds to the peripheral circuit portion 16. The film thickness of the insulator film 41 is adjusted to fall into the range of several hundreds nm to several $\mu$m, approximately equaling to the step 23.

Using the resist 42 as a mask and using the plate electrode 13 as a stopper, the insulator film 41 is wet-etched by a solution containing a hydrofluoric acid. As an alternative stopper for the wet etching, an SiN film (not shown) which has been deposited on the plate electrode 13 can also be used.

Next, as shown in FIG. 3, an another insulator film 43 is formed by depositing an SiO$_2$ film containing no impurities, a PSG film, an SiN film or a combined film of them and a BPSG film according to a CVD method, after a removal of segments in the contact between the diffused layer 31a and a bit line out of the plate electrode 13. Then, after planarizing the insulator film 43 by flowing the BPSG film through a high temperature annealing, contact holes 44 and 45 reaching the diffused layers 31a and 34b are formed in the insulator film 43.

Thereafter, an interlayer insulator 46 is formed by depositing an SiO$_2$ film containing no impurities, a PSG film, an SiN film or a combined film of them and a BPSG film according to a CVD method, after forming a bit line 24 contacting the diffused layers 31a and 34b through the contact holes 44 and 45 by patterning of a film of W, Mo, Ti, Ta or their silicide or polycide. Then, after planarizing the interlayer insulator 46 by flowing the BPSG film through a high temperature annealing, a contact hole 47 reaching the bit line 24 is formed in the interlayer insulator 46.

Thereafter, by patterning of an Aluminum wiring 25 which is a composite film of AlSi or AlSiCu with Ti or TiON and by forming a passivation film 48 with an SiN film, an SiON film or the like, a DRAM is completed. In this DRAM, the Aluminum wiring 25 is of single layer while a multiple-layered Aluminum wiring may also be applied.

In the first embodiment as explained above, the step 23 originating from both the storage node electrode 12 and the plate electrode 13 of the capacitor 11 is moderated by the insulator film 41 retained in the peripheral circuit portion 16. For this reason, even when the step 23 is increased up to about 1.0 $\mu$m by three-dimensionalizing the storage node electrode 12, a sufficiently large focus margin is secured during light exposure in a lithography process for patterning the bit line 24 and the Aluminum wiring 25 so that their patterning is easily feasible.

Figure 4:
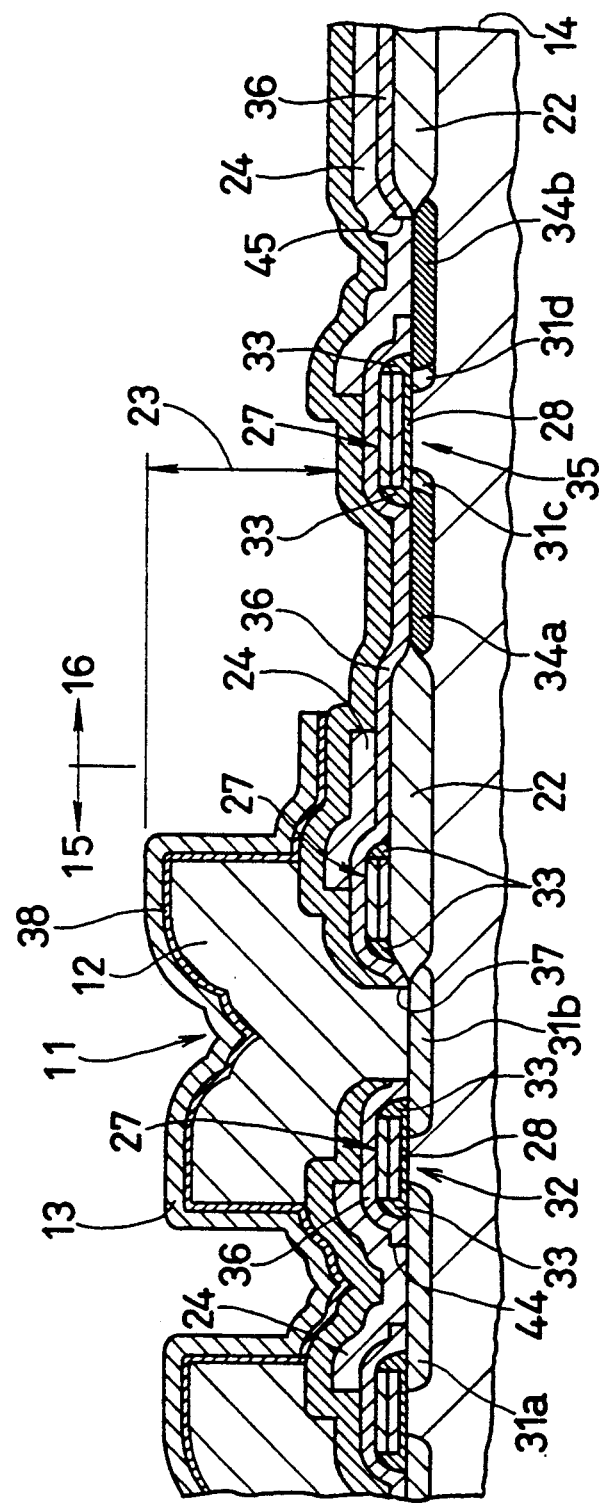
FIG. 4 is a sectional view of a DRAM at the initial stage of its manufacturing steps according to the second embodiment of the present invention.
Figure 5:
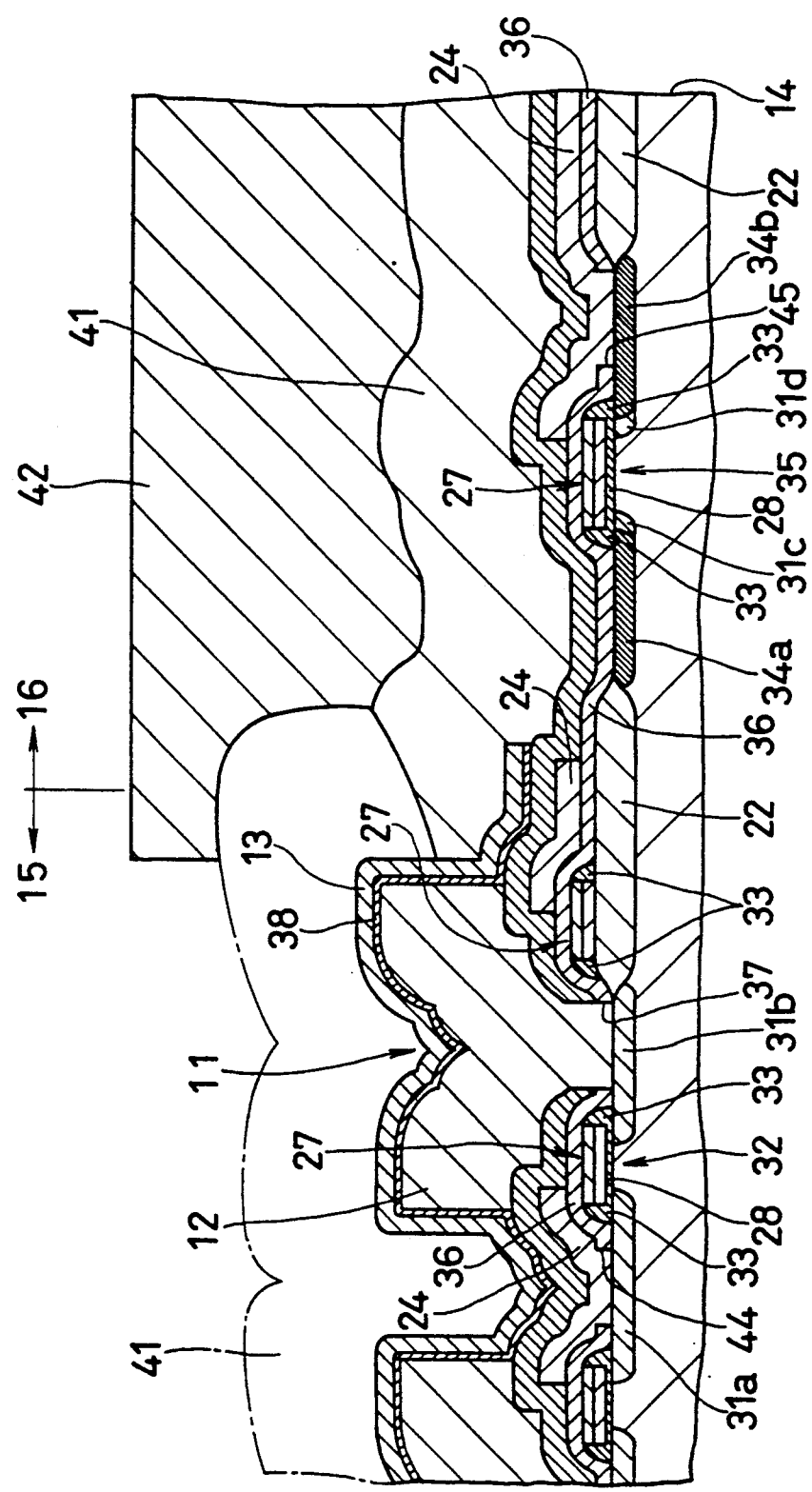
FIG. 5 is a sectional view of the DRAM at the middle stage of its manufacturing steps according to the second embodiment of the present invention.
Figure 6:
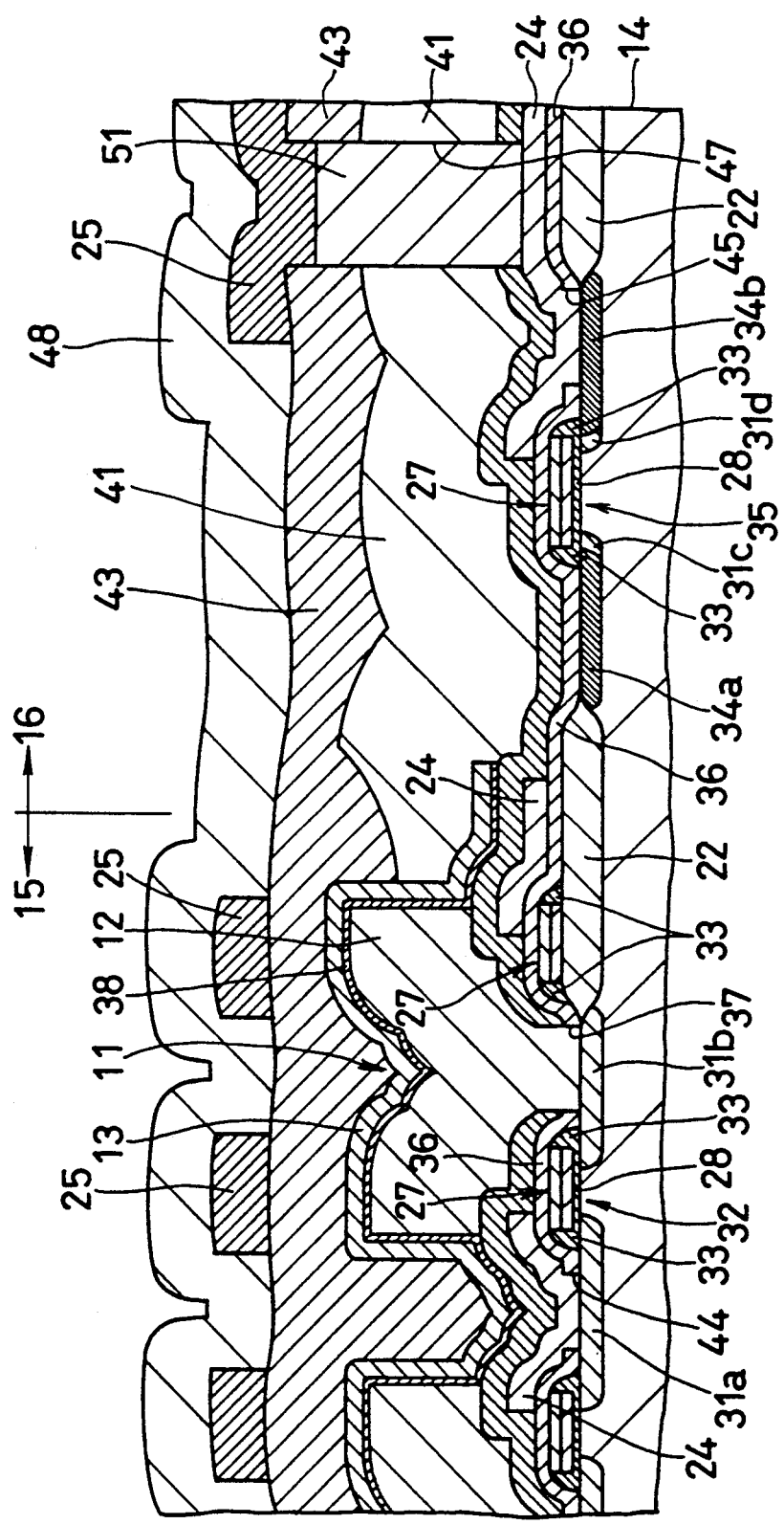
FIG. 6 is a sectional view of the DRAM at the final stage of its manufacturing steps according to the second embodiment of the present invention.

FIGS. 4 to 6 show the second embodiment of the present invention applied for manufacturing a stacked capacitor DRAM of so-called shielded bit line type wherein a capacitor 11 is formed after the formation of a bit line 24. In the second embodiment, essentially the same steps are carried out as in the first embodiment as explained above except that a capacitor 11 is formed after the formation of a bit line 24.

In the second embodiment, however, as shown in FIG. 6, since an aspect ratio of the contact hole 47 for the Aluminum wiring 25 gets larger because the contact hole 47 is exposed to the influence of the step 23, the contact hole 47 is filled up with a tungsten plug 51.

Figure 7:
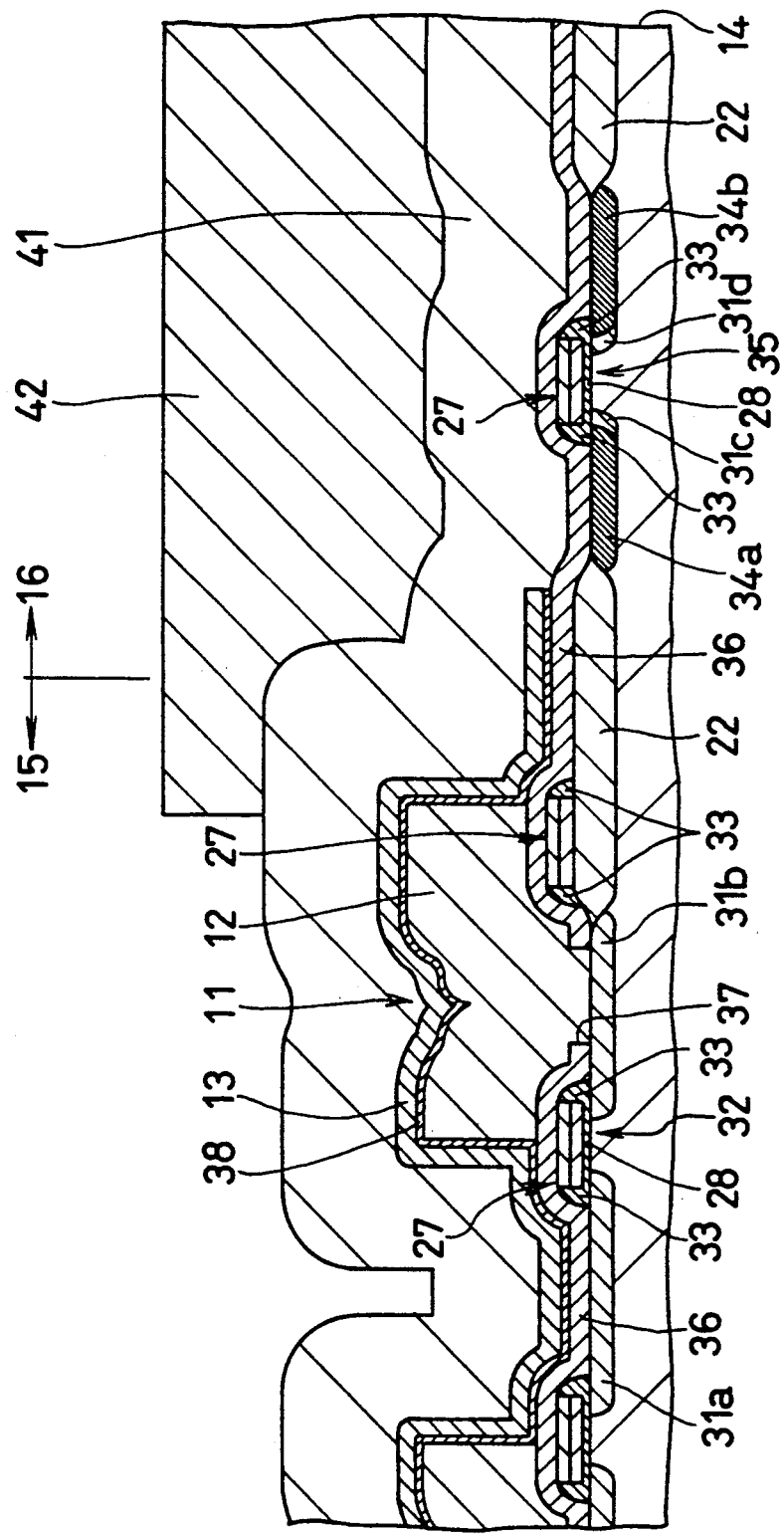
FIG. 7 is a sectional view of a DRAM at a possibly problematic stage of its manufacturing steps according to the first and second embodiments of the present invention.

By the way, in the above-mentioned first and second embodiments as shown in FIGS. 1 to 3 and FIGS. 4 to 6, respectively, the resist 42 serving as a mask on wet etching of the insulator film 41 is not subjected to a patterning in self-aligning fashion. As shown in FIG. 7, therefore, the pattern of the resist 42 can possibly be shifted relative to that of the underlaying field, e.g., in the direction of the memory cell array portion 15.

Figure 8:
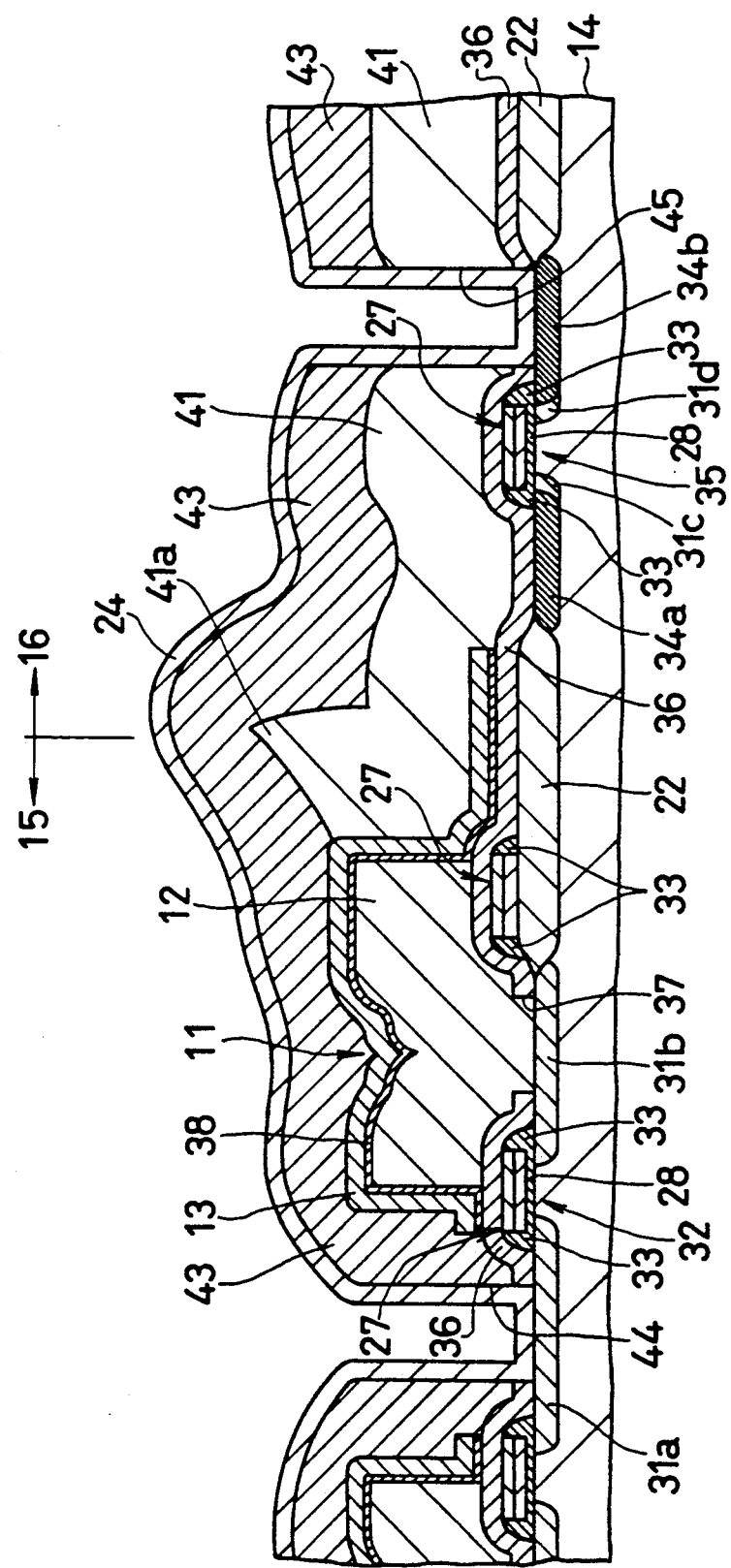
FIG. 8 is a sectional view of the DRAM at a stage following that of FIG. 7.

As a result of this, as shown in FIG. 8, a projection 41a is formed on the insulator film 41 at the boundary between the memory cell array portion 15 and the peripheral circuit portion 16. Due to this projection 41a, a step portion is formed. For this reason, patternings of wiring of the bit line 24 and the like on an upper layer placed above the capacitor 11 become difficult.

Figure 9:
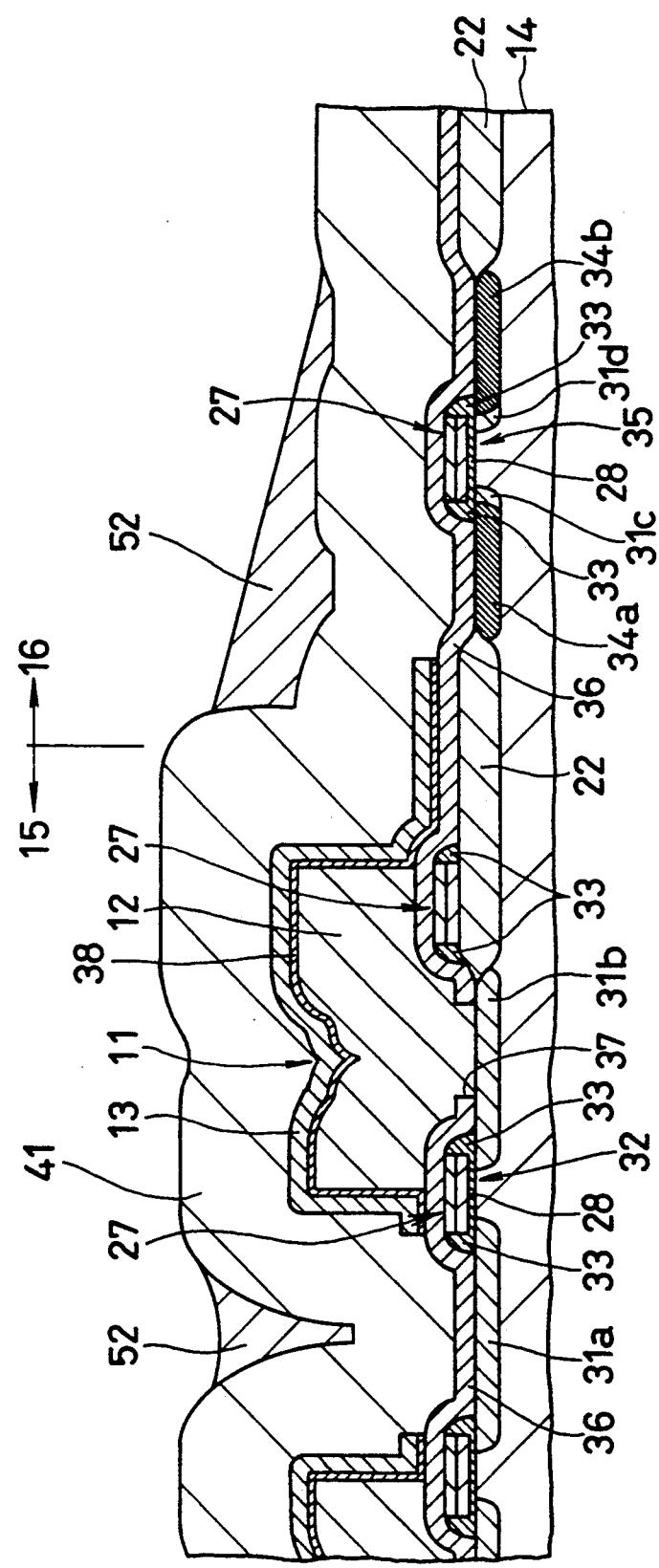
FIG. 9 is a sectional view of a DRAM at the initial stage of its manufacturing steps according to the third embodiment of the present invention.
Figure 10:
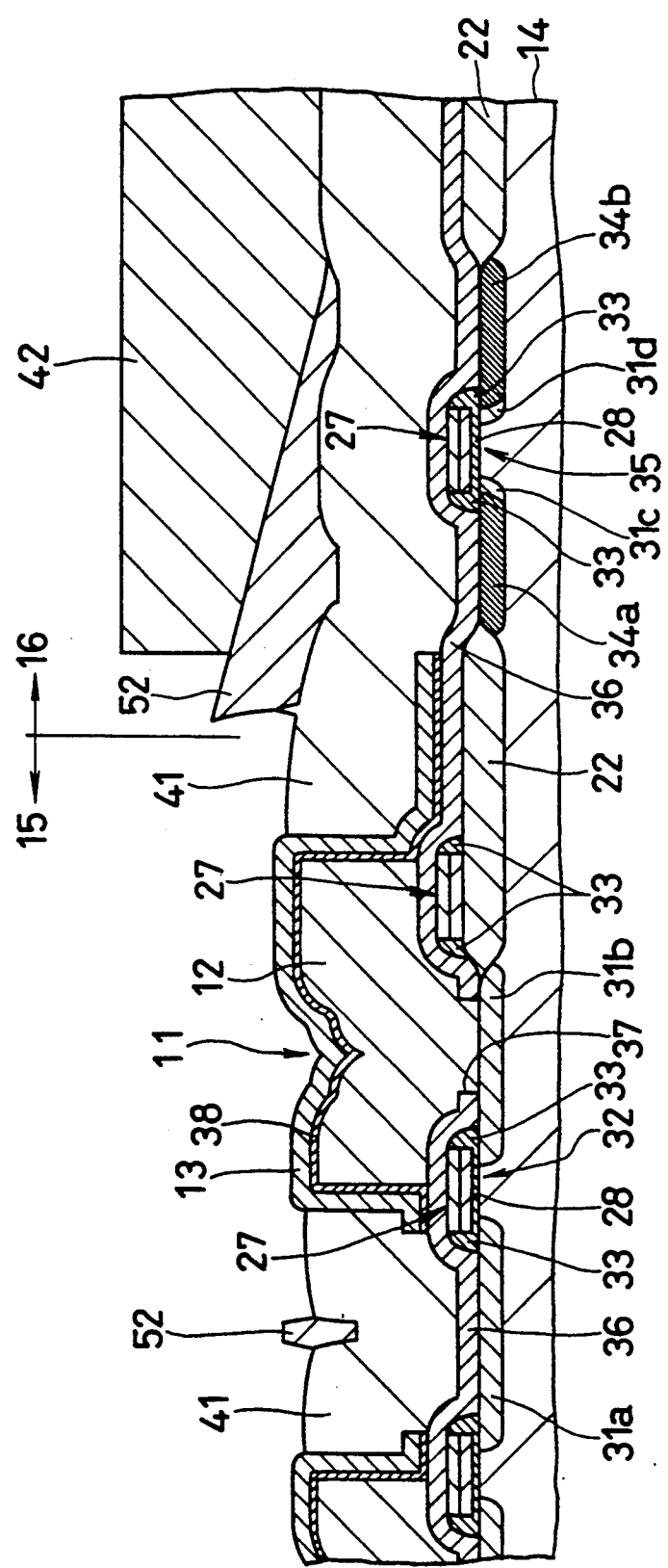
FIG. 10 is a sectional view of the DRAM at the middle stage of its manufacturing steps according to the third embodiment of the present invention.
Figure 11:
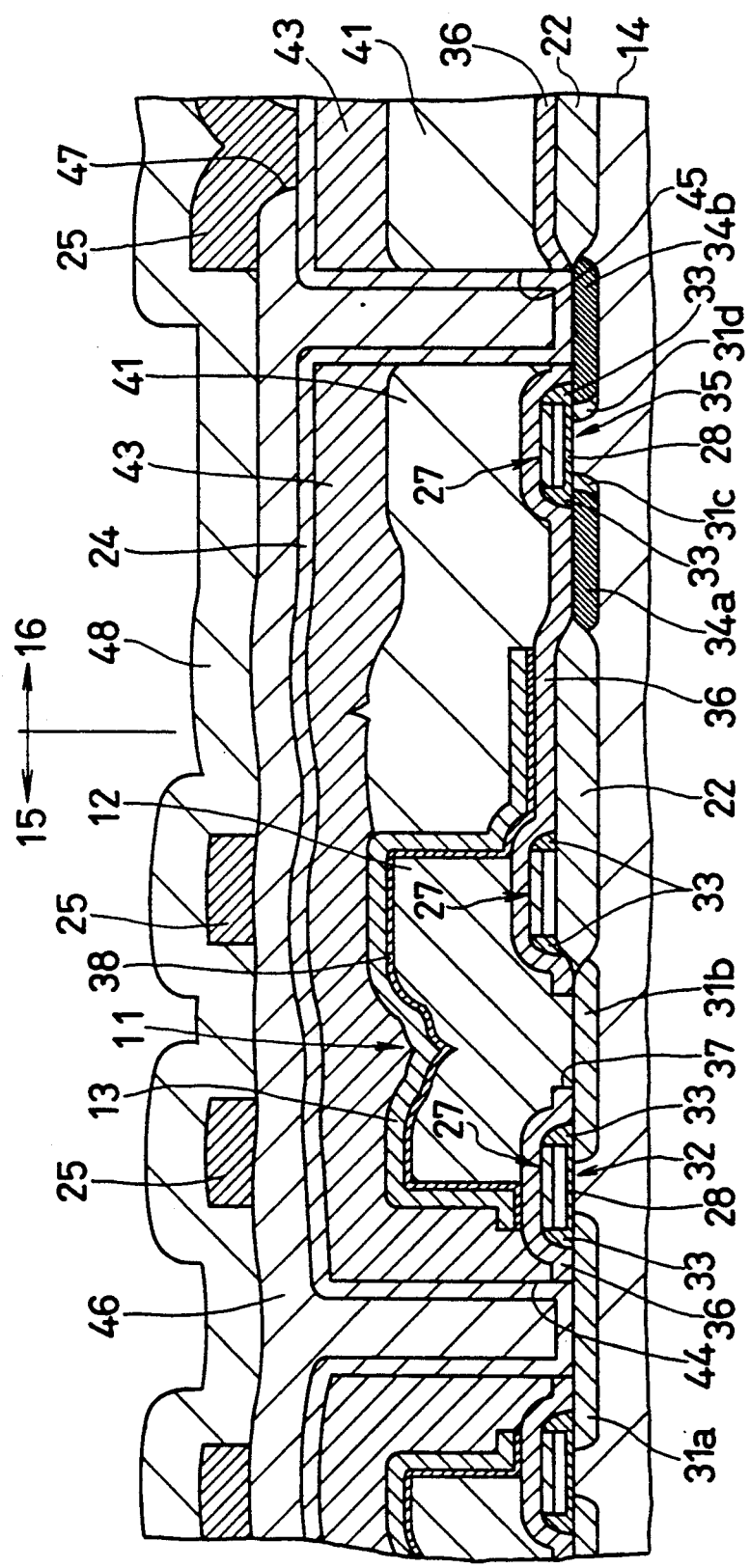
FIG. 11 is a sectional view of the DRAM at the final stage of its manufacturing steps according to the third embodiment of the present invention.

FIGS. 9 to 11 show the third embodiment of the present invention, wherein the above-mentioned problem is solved in the manufacturing of a stacked capacitor DRAM in which a bit line is formed after the formation of a capacitor. In the third embodiment also, as shown in FIG. 9, approximately the same steps as those in the above-mentioned first embodiment are carried out up to the formation of the insulator film 41. It is to be noted here, however, that the insulator film 41 may be formed by an SiN film, and that a segment in the contact between the diffused layer 31a and the bit line out of the plate electrode 13 is removed.

Thereafter, a resist 52 is coated in a thickness of several hundreds run to several m, and the resist 52 then is etched back using O$_2$ or CF$_4$+O$_2$ such that the resist 52 is retained only at step portions in self-aligning fashion. A polyimide resin or the like can be used instead of the resist 52.

Next, as shown in FIG. 10, the resist 42 is patterned such that the resist 42 covers only the peripheral circuit portion 16 and an edge of the resist 42 is located on the resist 52. If the edge of the resist 42 is only located on the resist 52, the pattern of the boolean ADD of the resists 42 and 52 will not be position-shifted even when the resist 42 is position-shifted.

Therefore, when the insulator film 41 is anisotropically dry etched using the resists 42 and 52 as a mask, only segments having higher steps on the capacitor 11 within the insulator film 41 are precisely removed. While the contact between the diffused layer 31a and the bit line 24 is also filled up with the insulator film 41 such that the whole including both the memory cell array portion 15 and the peripheral circuit portion 16 is planarized. Subsequently, as shown in FIG. 11, after similar steps to those for the first embodiment have been applied, a DRAM is completed.

Figure 12:
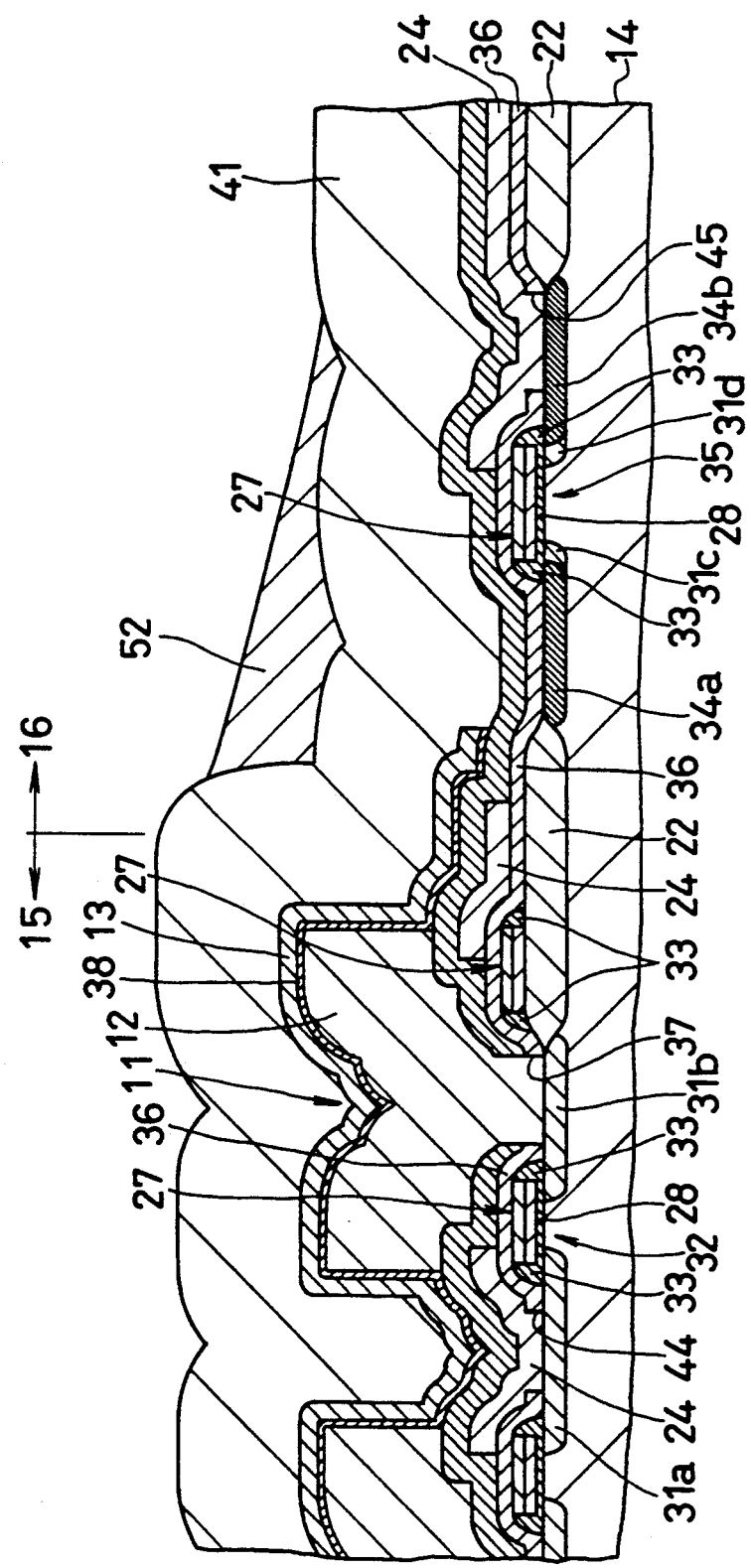
FIG. 12 is a sectional view of a DRAM at the initial stage of its manufacturing steps according to the fourth embodiment of the present invention.
Figure 13:
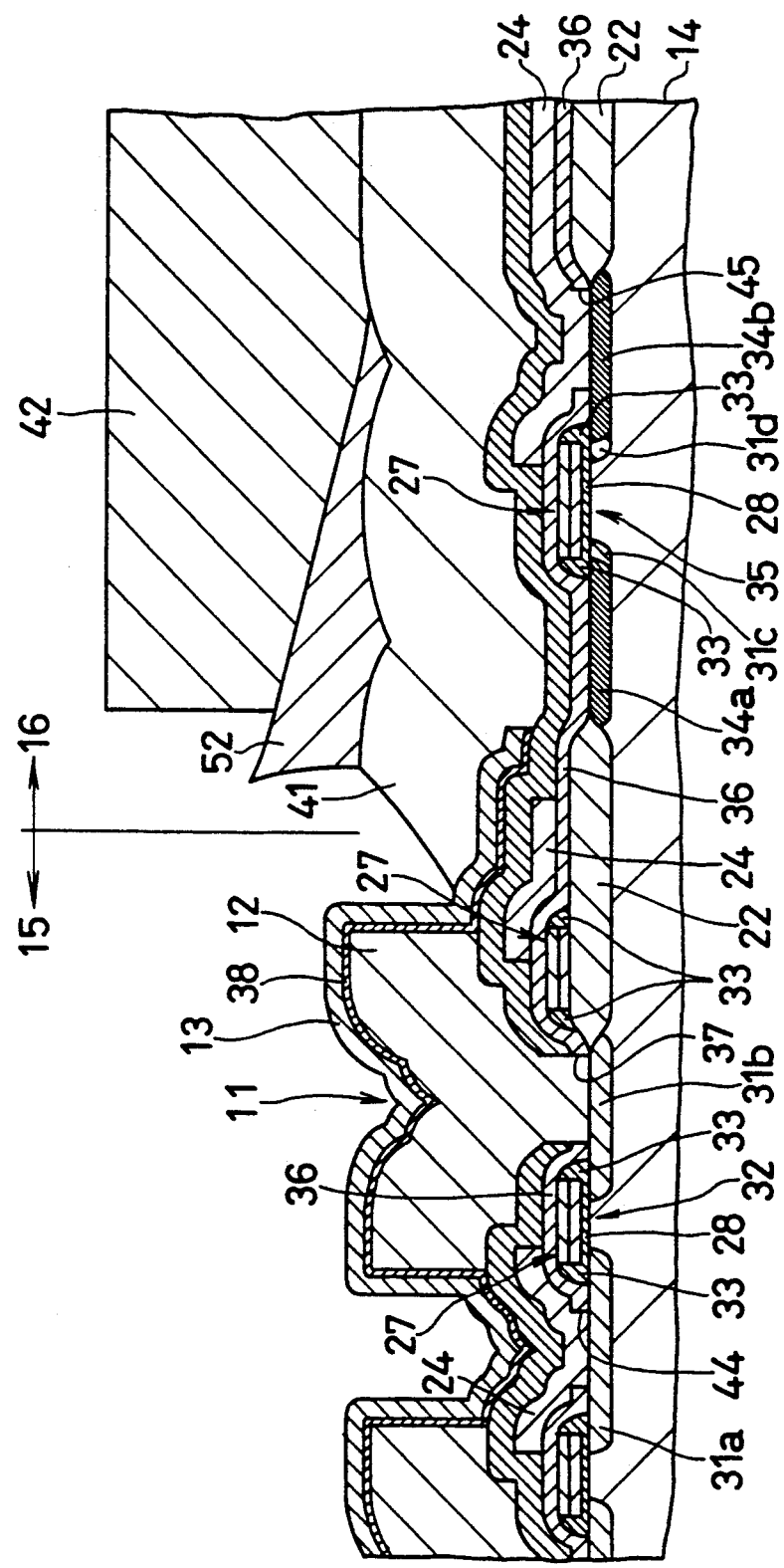
FIG. 13 is a sectional view of the DRAM at the middle stage of its manufacturing steps according to the fourth embodiment of the present invention.
Figure 14:
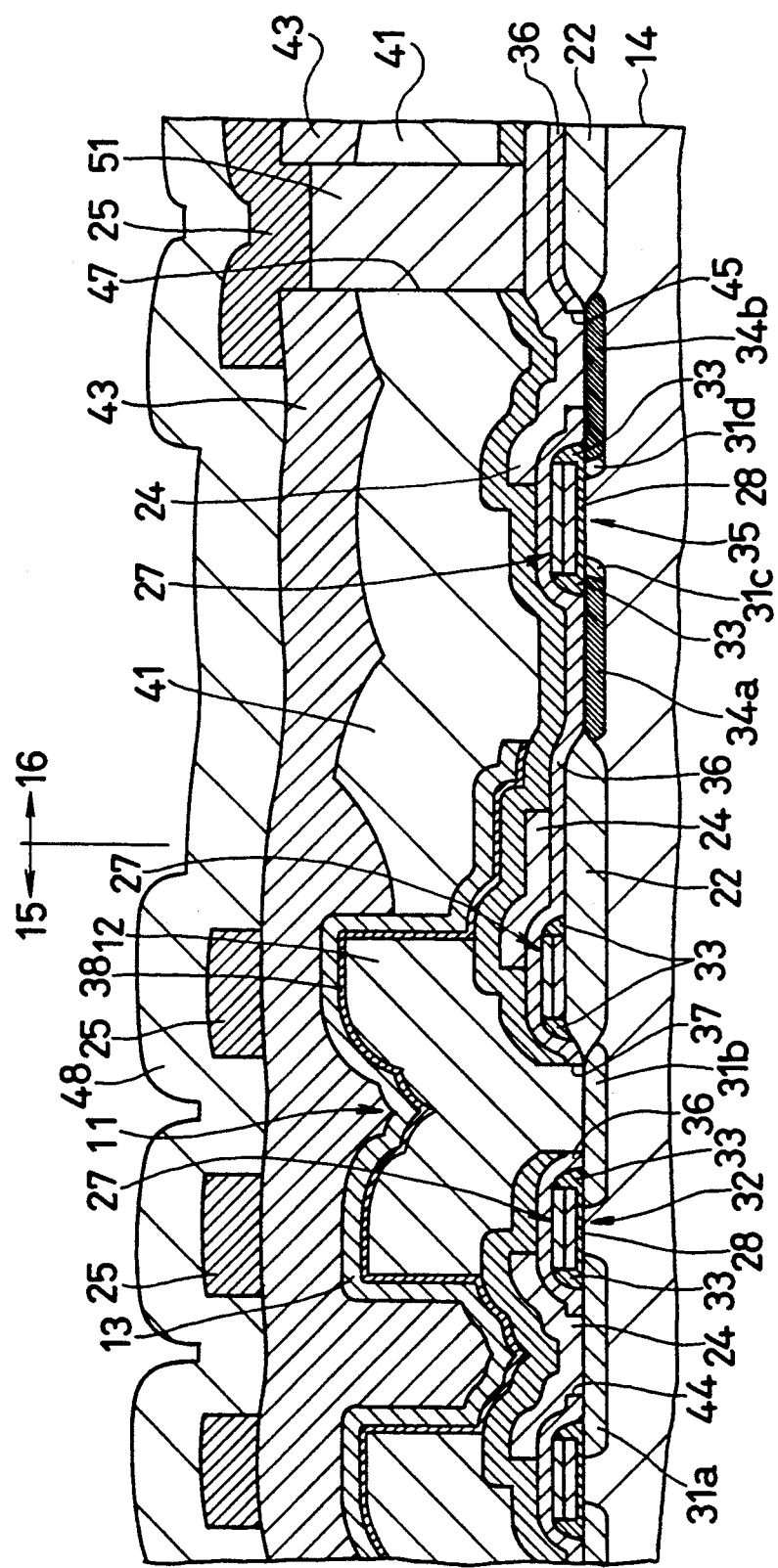
FIG. 14 is a sectional view of the DRAM at the final stage of its manufacturing steps according to the fourth embodiment of the present invention.
Figure 15:
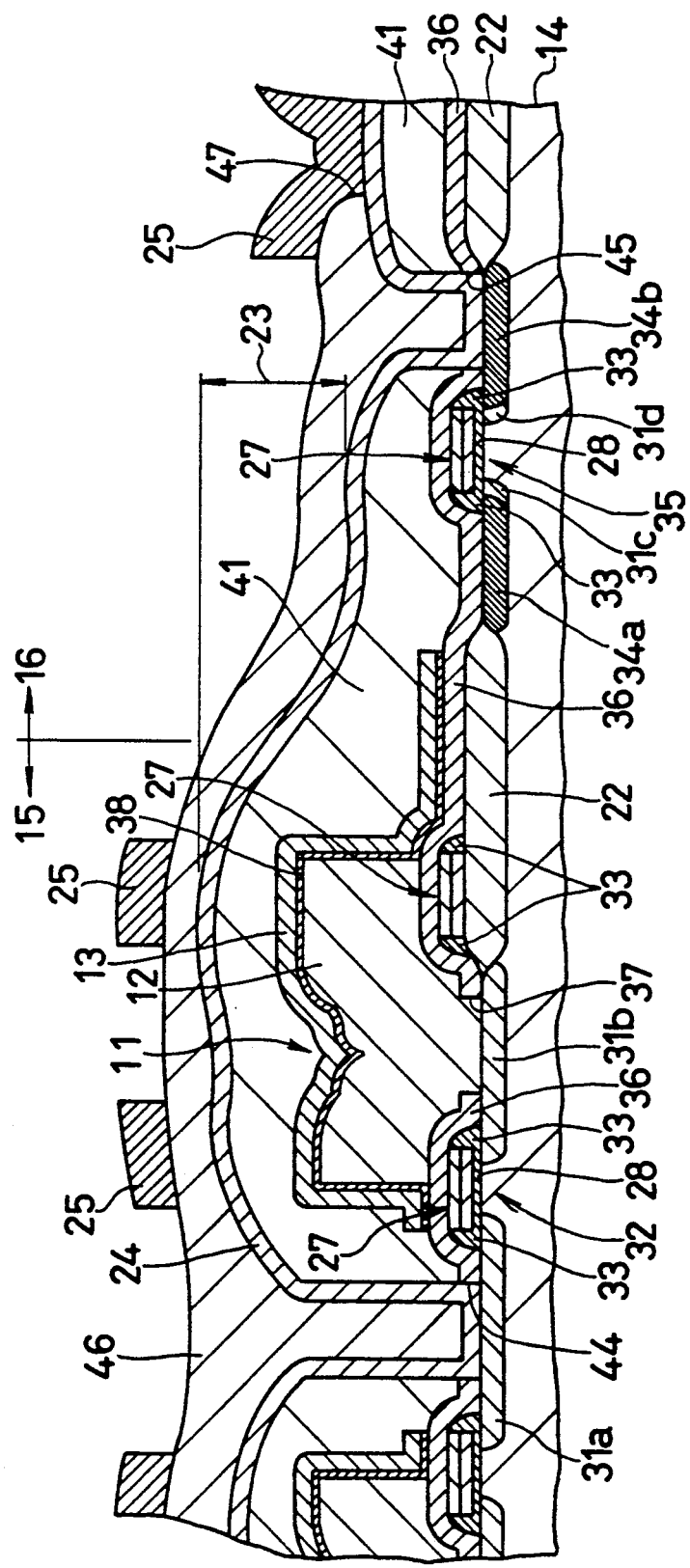
FIG. 15 is a sectional view of a DRAM manufactured according to the first conventional method.
Figure 16:
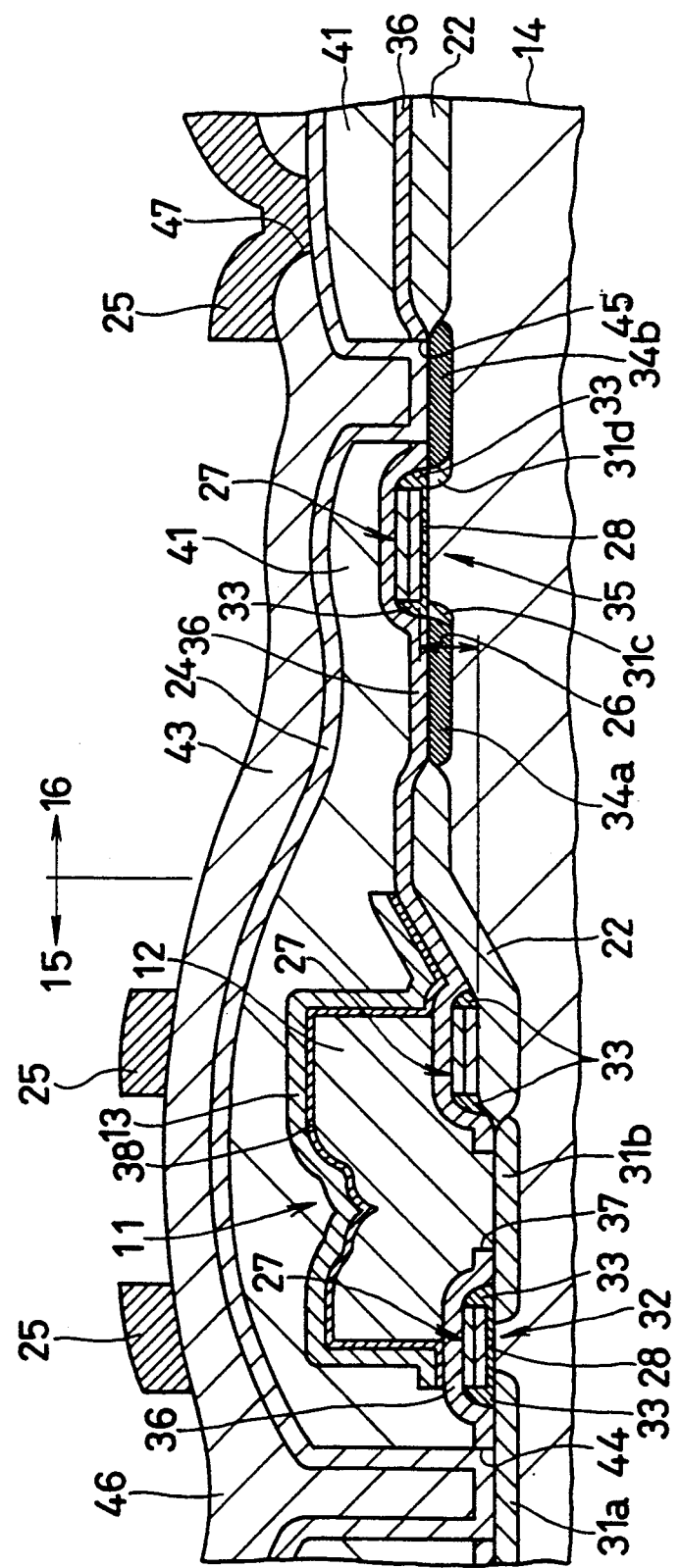
FIG. 16 is a sectional view of a DRAM manufactured according to the second conventional method.

FIGS. 12 to 14 show the fourth embodiment of the present invention applied for manufacturing a stacked capacitor DRAM of so-called shielded bit line type wherein the capacitor 11 is formed after the formation of the bit line 24. In the fourth embodiment, for a removal of the insulator film 41 in the memory cell array portion 15, resists 42 and 52 are used as masks similar to those in the third embodiment as is shown in FIGS. 9 to 11, and the wet etching is effected using the plate electrode 13 as a stopper, similar to that in the second embodiment as is shown in FIGS. 4 to 6.

While specific embodiments of the invention have been shown and disclosed, it is to be understood that numerous changes and modifications may be made by those skilled in the art without departing from the scope and intent of the invention.

What is claimed is:

1. A method of manufacturing semiconductor memory device having a memory cell array portion and a peripheral circuit portion wherein each memory cell comprises a transistor and a capacitor, comprising steps of:

forming said transistors on a semiconductor substrate of said memory cell array portion;

forming said capacitors on said substrate of said memory cell array portion, each capacitor comprising a storage node electrode and a plate electrode provided on said node electrode;

forming a first insulator film on the whole of said substrate on which said transistors and said capacitors are provided;

forming a photo resist on said first insulator film which corresponds to said peripheral circuit portion;

removing said first insulator film provided on said memory cell portion by using said photo resist as a mask; and forming a second insulator film on said plate electrodes of said capacitor and said first insulator film of said peripheral circuit portion.

2. A method of manufacturing semiconductor memory device according to claim 1, wherein said first insulator film of said memory cell array portion is removed by wet etching.

3. A method of manufacturing semiconductor memory device according to claim 1, wherein said first insulator film of said memory cell array portion is removed by using said plate electrodes provided on the whole of said memory cell array portion as a mask.

4. A method of manufacturing semiconductor memory device according to claim 1, comprising step of;

forming a silicon nitride film on said each plate electrode, wherein said first insulator film of said memory cell array portion is removed by using said silicon nitride films as a mask.

5. A method of manufacturing semiconductor memory device having a memory cell array portion and a peripheral circuit portion wherein each memory cell comprises a transistor and a capacitor, comprising steps of:

forming said transistors on a semiconductor substrate of said memory cell array portion;

forming said capacitors on said substrate of said memory cell array portion, each capacitor comprising a storage node electrode and a plate electrode provided on said node electrode;

forming a first insulator film on the whole of said substrate on which said transistors and said capacitors are provided; said first insulator film having a step portion, forming a first photo resist on said step portion of said first insulator film;

forming a second photo resist such that an edge of said second photo resist is located on said first photo resist;

removing said first insulator film provided on said memory cell portion by using said first and second photo resist as a mask; and forming a second insulator film on said plate electrodes of said capacitor and said first insulator film of said peripheral circuit portion.

6. A method of manufacturing semiconductor memory device according to claim 5, wherein said first insulator film of said memory cell array portion is removed by wet etching.

7. A method of manufacturing semiconductor memory device according to claim 5, wherein said first insulator film of said memory cell array portion is removed by an isotropic dry etching.

8. A method of manufacturing semiconductor memory device according to claim 5, wherein said first insulator film of said memory cell array portion is removed by using said plate electrodes provided on the whole of said memory cell array portion as a mask.

9. A method of manufacturing semiconductor memory device according to claim 5, comprising step of;

forming a silicon nitride film on said each plate electrode, wherein said first insulator film of said memory cell array portion is removed by using said silicon nitride films as a mask.

* * * * *